(12) United States Patent
Platero Gaona et al.

(10) Patent No.: US 11,336,082 B2
(45) Date of Patent: May 17, 2022

(54) SYSTEM AND METHOD FOR PROTECTING AGAINST FAULTS BETWEEN TURNS IN EXCITATION WINDINGS OF SYNCHRONOUS MACHINES WITH STATIC EXCITATION

(71) Applicant: Universidad Politécnica de Madrid, Madrid (ES)

(72) Inventors: Carlos Antonio Platero Gaona, Madrid (ES); Miguel Ángel Pardo Vicente, Madrid (ES); Emilio Rebollo López, Madrid (ES); Ricardo Granizo Arrabé, Madrid (ES)

(73) Assignee: UNIVERSIDAD POLITÉCNICA DE MADRID, Madrid (ES)

( * ) Notice: Subject to any disclaimer, the term of this patent is extended or adjusted under 35 U.S.C. 154(b) by 243 days.

(21) Appl. No.: 16/765,925

(22) PCT Filed: Nov. 22, 2018

(86) PCT No.: PCT/ES2018/070754
§ 371 (c)(1),
(2) Date: May 21, 2020

(87) PCT Pub. No.: WO2019/102055
PCT Pub. Date: May 31, 2019

(65) Prior Publication Data
US 2020/0335965 A1    Oct. 22, 2020

(30) Foreign Application Priority Data

Nov. 22, 2017   (ES) ................................ ES201731347

(51) Int. Cl.
*H02H 7/08* (2006.01)
*H02H 1/00* (2006.01)
*H03K 5/24* (2006.01)

(52) U.S. Cl.
CPC ............ *H02H 7/08* (2013.01); *H02H 1/0007* (2013.01); *H03K 5/24* (2013.01)

(58) Field of Classification Search
CPC ........... H02H 7/08; H02H 1/0007; H03K 5/24
See application file for complete search history.

(56) References Cited

U.S. PATENT DOCUMENTS

| | | | |
|---|---|---|---|
| 8,135,551 B2 | 3/2012 | Tiwari et al. | |
| 8,354,809 B2 * | 1/2013 | Mehlhorn | ........... F04D 15/0236 318/434 |

(Continued)

FOREIGN PATENT DOCUMENTS

| | | |
|---|---|---|
| CN | 102135601 A | 7/2011 |
| EP | 2077612 A2 | 7/2009 |

(Continued)

OTHER PUBLICATIONS

Blánquez et al., "Field-winding fault detection in synchronous machines with static excitation through frequency response analysis", Electrical Power and Energy Systems, 2015, pp. 229-239, vol. 73, Elsevier Ltd.

(Continued)

*Primary Examiner* — Zoheb S Imtiaz
(74) *Attorney, Agent, or Firm* — Jayne Marie Saydah

(57) ABSTRACT

The invention relates to a system and method for protecting against faults between turns in excitation windings of synchronous machines with static excitation, which is based on comparison between the excitation intensity measured and the theoretical excitation current calculated for that operating point using the voltage and current measurements in the armature.

12 Claims, 2 Drawing Sheets

(56) References Cited

U.S. PATENT DOCUMENTS

| | | |
|---|---|---|
| 2008/0136360 A1 | 6/2008 | Rai |
| 2014/0265960 A1* | 9/2014 | Sonoda .................. H02P 6/12 |
| | | 318/400.21 |
| 2015/0198668 A1 | 7/2015 | Viswanathan et al. |
| 2015/0311848 A1* | 10/2015 | Maruyama ........... H02K 11/044 |
| | | 318/490 |
| 2016/0025811 A1 | 1/2016 | Kasztenny et al. |

FOREIGN PATENT DOCUMENTS

| | | |
|---|---|---|
| ES | 2426970 T3 | 10/2013 |
| ES | 2534950 A1 | 4/2015 |
| SU | 598174 A1 | 3/1978 |

OTHER PUBLICATIONS

Blánquez et al., "Improvement of the Ground-Fault Detection in Field Windings of Synchronous Machines with Static Excitation based on Third-Harmonic Voltage Phase-Angle Comparison", From the 17th European Conference on Power Electronics and Applications, 2015.

Platero Gaona et al., "A Novel Rotor Ground-Fault-Detection Technique for Synchronous Machines with Static Excitation", IEEE Transactions on Energy Conversion, Dec. 2010, pp. 965-973, vol. 25(4), Institute of Electrical and Electronics Engineers.

* cited by examiner

SYSTEM AND METHOD FOR PROTECTING AGAINST FAULTS BETWEEN TURNS IN EXCITATION WINDINGS OF SYNCHRONOUS MACHINES WITH STATIC EXCITATION

CROSS-REFERENCE TO RELATED APPLICATIONS

This application is the United States national phase of International Application No. PCT/ES2018/070754 filed Nov. 22, 2018, and claims priority to Spanish Patent Application No. P201731347 filed Nov. 22, 2017, the disclosures of which are hereby incorporated by reference in their entirety.

BACKGROUND OF THE INVENTION

Object of the Invention

The present invention aims to develop a novel protection for faults between turns in excitation windings of synchronous machines with static excitation capable of detecting this type of defect with the machine in operation.

A clear application is in electric power generation systems, wherein synchronous generators are used. The aim of the system object of the present invention is to detect the defect between turns in the excitation windings in machines with static excitation.

Technical Problem to be Resolved

Every electrical installation must be equipped with protection systems that make it safe from possible short circuits and other defects that may cause damage to both the facilities themselves and people.

In the case of generation units, said protections must further guarantee the supply of energy to the grid in the most reliable way possible, trying to differentiate the severity levels of the faults that occur.

One of the possible defects that may occur in synchronous machines is the fault between turns in excitation windings.

The excitation windings are powered by direct current. The defect between turns in these windings may not be dangerous, a certain percentage of short-circuited turns being admitted in some machines for detecting this type of defect.

Therefore, it is usually common practice to perform tests on the excitation windings when the machines are stopped.

One of the most widely-used methods is the one known as pole-drop testing. This test consists of powering the excitation winding with a certain voltage and checking the voltage at each of the poles making up the winding. If any of the measured voltages is lower than that of the rest of the poles, this indicates that there is a defect between turns in the corresponding pole. Normally this test is performed with a voltage source having an alternating current, although it also works in direct current.

Another method is to apply a voltage wave with many frequencies and analyse the frequency response of the winding. This can be done with a square wave (Dirac delta) or with a sine wave wherein the frequency varies. To assess whether the winding has a defect or not, the test result must be compared with another test under normal conditions with no defects. Another possibility is to perform the test pole by pole and compare them, if any pole has a different frequency response, this indicates that it has a defect.

All of these methods require the machine to be out of service in order to check if there is a fault between turns in the excitation winding.

It is also convenient to take into account a series of patents related to the invention:

PCT/US2010/021948 (25 Jan. 2010) ES2426970 T3 (28 Oct. 2013) General Electric Company (100.0%) ROBUST ON LINE STATOR TURN FAULT IDENTIFICATION SYSTEM.

P201431921 (23 Dec. 2014) ES2534950 A1 (30 Apr. 2015) UNIVERSIDAD POLITÉCNICA DE MADRID (100.0%) System and method for protecting against faults between turns in synchronous machines

SUMMARY OF THE INVENTION

In order to provide a solution to the aforementioned problem, the following system and method for protecting against faults (short circuits) between turns in excitation windings of synchronous machines with static excitation are disclosed.

The system and method objects of the invention offer a protection for synchronous electric machines with static excitation which detects defects between turns of the excitation coils.

The magnetomotive force created by the excitation winding of a synchronous machine is the product of the number of turns and the current flowing through the winding.

The principle of operation of this protection is based on the fact that in the case of a short circuit between turns in the excitation winding, in order to produce the same magnetomotive force it is necessary for more current to flow. Therefore, in the case of a fault between turns for certain operating conditions, the excitation current must increase proportionally to the number of short-circuited turns.

The system for protecting against faults between turns in excitation windings of synchronous machines with static excitation includes:
- at least one excitation current sensor, connected to the excitation winding of the synchronous machine;
- at least one armature current meter, connected to a phase of the armature winding of the synchronous machine;
- at least one armature voltage meter, connected to said phase of the armature winding of the synchronous machine;
- a calculation module, connected to said at least one armature current meter and to said at least one armature voltage meter, wherein the calculation module is configured to calculate a theoretical excitation current as a function of at least one armature current measurement and at least one armature voltage measurement;
- a comparator module, connected to said at least one excitation current sensor and to the calculation module, wherein the comparator module is configured to:
  - make a comparison between at least one excitation current measurement and the theoretical excitation current multiplied by a certain coefficient, and;
  - send a trip signal to a protection device, if it detects that the excitation current measurement is greater than the theoretical excitation current multiplied by the mentioned coefficient.

Preferably, the system for protecting against faults between turns includes a timer connected to the comparator module. The timer is configured to delay, during a predetermined time interval, sending the trip signal to the protection device.

According to a possible embodiment of the invention, the system for protecting against faults between turns includes three armature current meters, each respectively connected to a phase of the armature winding of the synchronous machine. Likewise, according to this embodiment of the invention, the system for protecting against faults between turns includes three armature voltage meters, each respectively connected to a phase of the armature winding of the synchronous machine.

According to another embodiment of the invention, the system for protecting against faults between turns includes two armature current meters, each respectively connected to a phase of the armature winding of the synchronous machine, and two armature voltage meters, each respectively connected to the mentioned phases of the armature winding of the synchronous machine.

According to an aspect of the invention, each armature current meter comprises a current transformer.

Also according to an aspect of the invention, each armature voltage meter comprises a voltage transformer.

As already mentioned, the present invention also relates to a method for protecting against faults between turns in excitation windings of synchronous machines with static excitation.

The method for protecting against faults between turns, object of the present invention, comprises:
- performing at least one excitation current measurement in the excitation winding of a synchronous machine;
- performing at least one armature current measurement in at least one phase of the armature winding of said synchronous machine;
- performing at least one armature voltage measurement in said phase of the armature winding of a synchronous machine;
- calculating a theoretical excitation current as a function of said at least one armature current measurement and of said at least one armature voltage measurement;
- multiplying the calculated theoretical excitation current by a certain coefficient, "k";
- making a comparison between the excitation current measurement and the calculated theoretical excitation current, multiplied by the mentioned coefficient "k";
- sending a trip signal to a protection device, if it detects that the value of the excitation current measurement is greater than the calculated theoretical excitation current, multiplied by the mentioned coefficient "k".

Preferably, the method for protecting against faults between turns comprises delaying the sending of the trip signal to the protection device, during a certain time interval. This is done with the aim of preventing spurious trips. In this manner, if after the mentioned certain time interval it is detected that the value of the excitation current measurement continues to be greater than the calculated theoretical excitation current, multiplied by the coefficient, "k", the trip signal is sent to the protection device.

According to a first embodiment of the method for protecting against faults between turns, the method comprises performing at least one armature current measurement in each of the three phases of the armature winding of the synchronous machine, and; performing at least one armature voltage measurement in each of the three phases of the armature winding of the synchronous machine.

According to another embodiment of the method for protecting against faults between turns, the method comprises performing at least one armature current measurement in two phases (any of them) of the armature winding of the synchronous machine, and; performing at least one armature voltage measurement in said two of the three phases of the armature winding of the synchronous machine.

BRIEF DESCRIPTION OF THE DRAWINGS

To complement the description that is being made and for the purpose of helping to better understand the features of the invention, a set of drawings is attached as an integral part of said description in which the following is depicted in an illustrative and non-limiting manner.

DETAILED DESCRIPTION OF THE INVENTION

Figure 1:
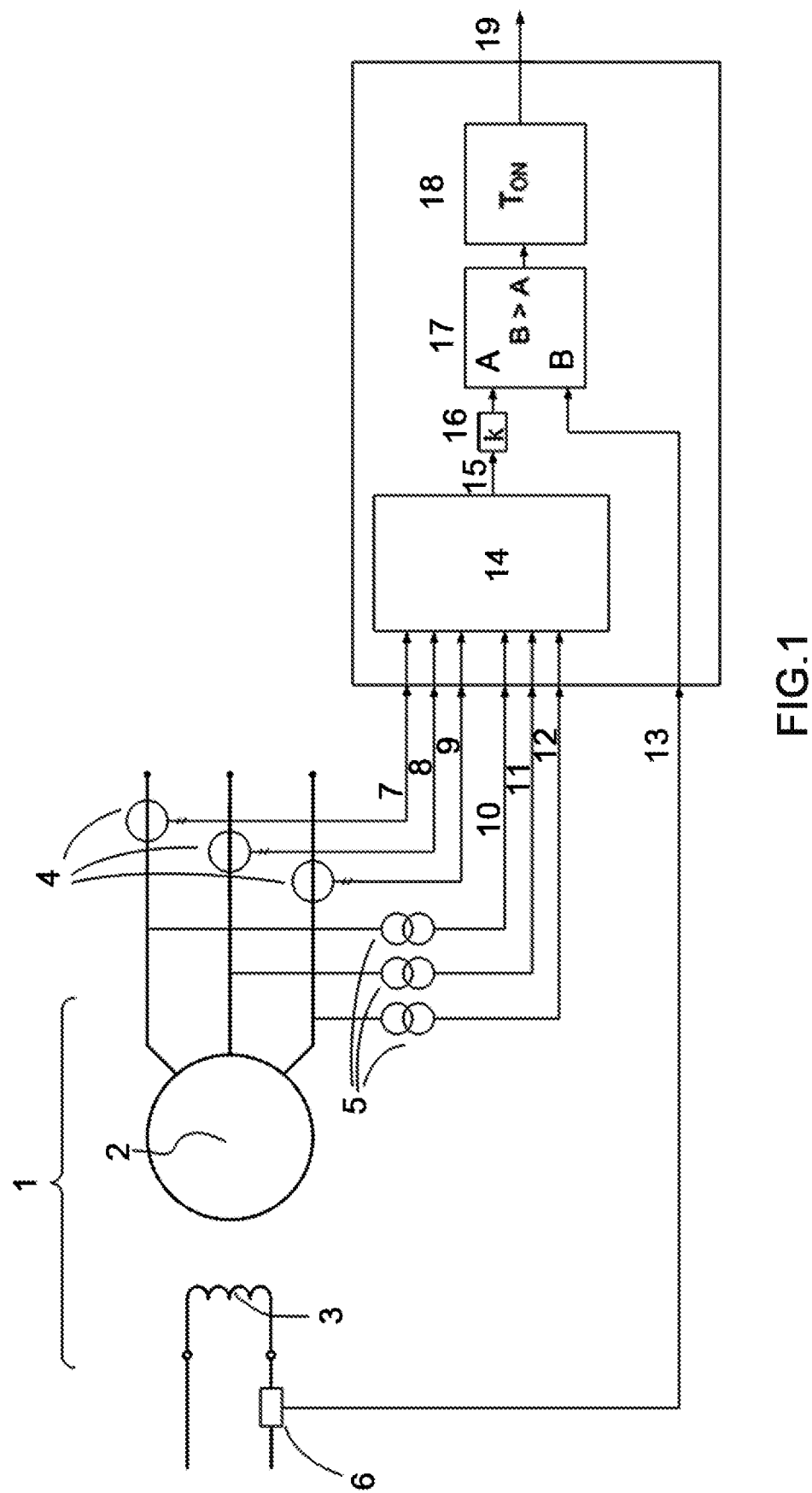
FIG. 1 shows a diagram of a first embodiment of the system for protecting against faults between turns in excitation windings of synchronous machines with static excitation.
Figure 2:
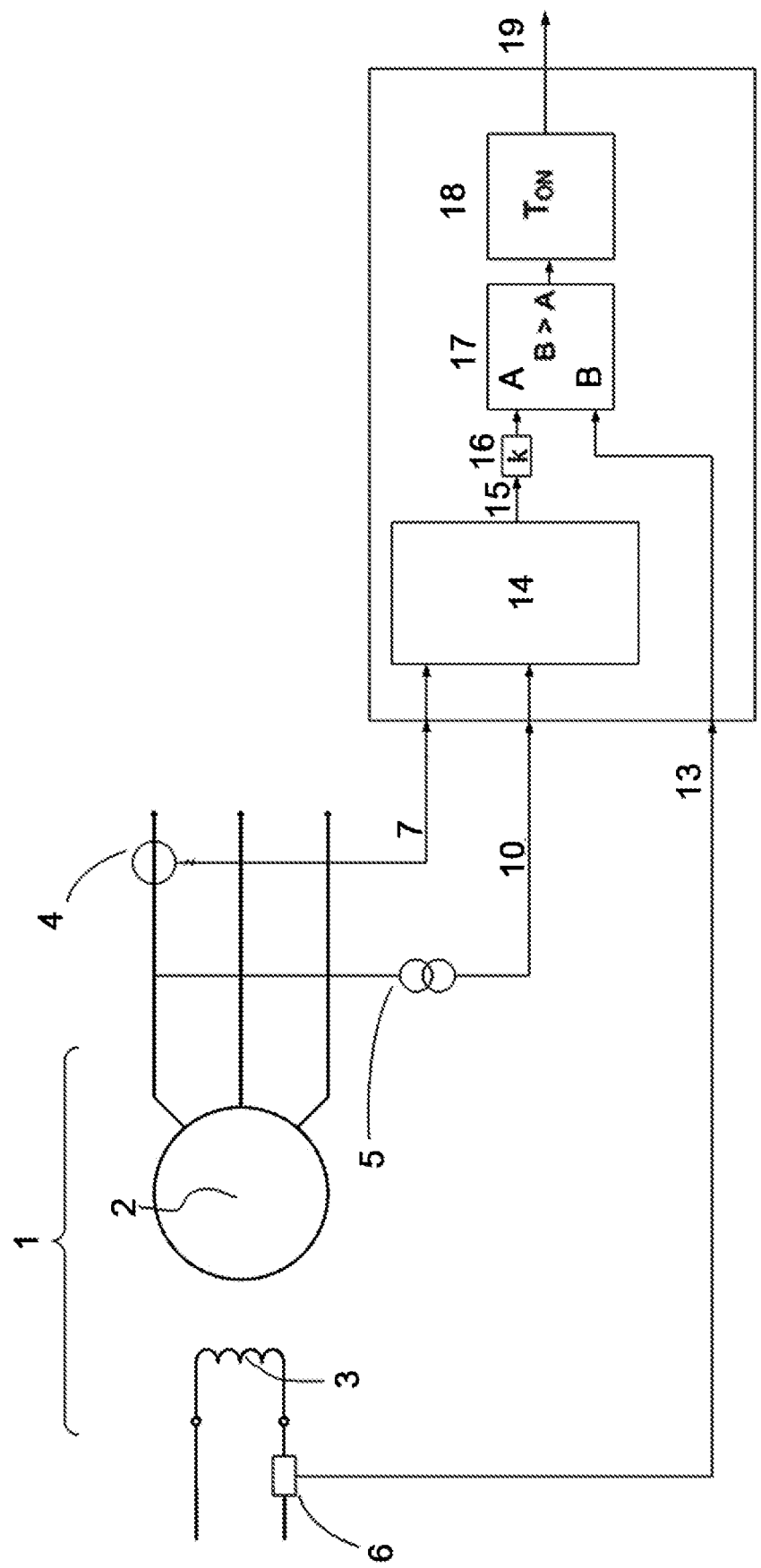
FIG. 2 shows a diagram of a second embodiment of the system for protecting against faults between turns in excitation windings of synchronous machines with static excitation.

The present invention relates, as already mentioned, to a system and method for protecting against faults (short circuits) between turns in excitation windings of synchronous machines (1) with static excitation.

The system for protecting against faults between turns includes an excitation current sensor (6), for obtaining excitation current measurements (13). The excitation current sensor (6) is connected to the excitation winding (3) of a synchronous machine (1). The output of said excitation current sensor (6) is the excitation current measurement (13).

The system for protecting against faults between turns includes at least one armature current meter (4), for obtaining armature current measurements (7, 8, 9). Each armature current meter (4) is connected to a phase of the armature winding of the synchronous machine (1). The output of each armature current meter (4) is the armature current measurement (7, 8, 9).

Additionally, the system for protecting against faults between turns includes at least one armature voltage meter (5), for obtaining armature voltage measurements (10, 11, 12). Each armature voltage meter (5) is connected to a phase of the armature winding of the synchronous machine (1). The output of each armature voltage meter (5) is the armature voltage measurement (10, 11, 12).

The system for protecting against faults between turns includes a calculation module (14). The outputs of each armature current meter (4) and each armature voltage meter (5) are connected at the input of said calculation module (14).

The calculation module (14) is configured to calculate, as a function of the armature current measurements (7, 8, 9) and as a function of the armature voltage measurements (10, 11, 12), the theoretical excitation current (15) that should flow through the excitation winding (3). Therefore, the output of said calculation module (14) is the calculated theoretical excitation current (15).

The calculation of the theoretical excitation current (15) is performed based on an equivalent model of the synchronous machine (1).

Different equivalent models of the synchronous machine (1) can be used.

If the excitation current measurement (13), measured by the excitation current sensor (6) is considerably higher than the calculated theoretical excitation current (15), it can be concluded that there is a defect (short circuit) between the turns in the excitation winding (3).

Under normal conditions, it is assumed and admitted that in a synchronous machine (1) there may be a certain number of short-circuited turns in the excitation winding (3). Therefore, it is relatively normal for the excitation current measurement (13), measured by the excitation current sensor (6), to be somewhat higher than a certain calculated theoretical excitation current (15).

Preferably, the system for protecting against faults between turns object of the present invention is configured to multiply the theoretical excitation current (15), calculated in the calculation module (14), by a coefficient "k" (16). This coefficient k (16) absorbs the effect of the increase in the excitation current caused by a certain number of short-circuited turns, in the excitation winding (3), which is considered admissible.

The system for protecting against faults between turns includes a comparator module (17).

The output of the calculation module (14), previously multiplied by the coefficient k (16), is connected at an input of the comparator module (17).

The output of the excitation current sensor (6) is connected at another input of the comparator module (17).

The comparator module (17) is configured to make the comparison between the excitation current measurement (13) and the theoretical excitation current (15), calculated in the calculation module (14), multiplied by the coefficient k (16).

In this manner, the trip threshold of a protection device (not shown) can be adjusted depending on a certain admissible number of short-circuited turns in the excitation winding (3). The protection device is configured to interrupt the current supply to the excitation winding (3) of the synchronous machine (1).

Therefore, the system for protecting against faults between turns is configured to send a trip signal (at the output of the comparator module (17)) to the protection device, if it detects that the excitation current measurement (13), "B", taken by the excitation current sensor (6), is greater than the theoretical excitation current (15), calculated in the calculation module (14), multiplied by the coefficient k (16), "A".

Preferably, the system for protecting against faults between turns includes an adjustable timer (18) for preventing spurious firing. The timer is inserted between the comparator module (17) and the protection device. The output of the comparator module (17) is connected at an input of the timer (18).

The timer (18) is configured to delay, during a predetermined period of time, the trip signal to the protection device.

If, after said predetermined period of time (Ton) has passed, the comparator module (17) continues to detect that the excitation current measurement (13), taken by the excitation current sensor (6), is greater than the theoretical excitation current (15), calculated in the calculation module (14), multiplied by the coefficient k (16), the timer (18) lets the trip signal (19) pass through to the protection device.

According to a possible implementation of the present system for protecting against faults between turns in excitation windings of synchronous machines (1), the protection device is a relay.

According to a first embodiment, the device for protecting against faults between turns includes a first armature current meter (4) connected to a first phase "a" of the armature winding; a second armature current meter (4) connected to a second phase "b" of the armature winding, and; a third armature current meter (4) connected to a third phase "c" of the armature winding.

According to this first embodiment, the device for protecting against faults between turns preferably includes a first armature voltage meter (5) connected to the first phase "a" of the armature winding; a second armature voltage meter (5) connected to the second phase "b" of the armature winding, and; a third armature voltage meter (5) connected to the third phase "c" of the armature winding.

According to a second embodiment, the device for protecting against faults between turns includes only one armature current meter (4) connected to a first phase "a" of the armature winding, and; only one armature voltage meter (5) connected to the first phase "a" of the armature winding. However, in this second embodiment, the current meter (4) and the voltage meter (5) can be connected to any of the phases of the armature winding.

Likewise, according to a possible embodiment (not shown), the system for protecting against faults between turns includes two armature current meters (4) connected to any two phases of the armature winding and two armature voltage meters (5) connected to said phases of the armature winding.

Preferably, each armature current meter (4) comprises a current transformer.

Likewise, preferably, each armature voltage meter (5) comprises a voltage transformer.

As mentioned, the present invention also relates to a method for protecting against faults between turns in excitation windings of synchronous machines with static excitation.

The method for protecting against faults between turns comprises:
  performing at least one excitation current measurement (13) in the excitation winding (3) of a synchronous machine (1);
  performing at least one armature current measurement (7, 8, 9) in at least one phase of the armature winding of said synchronous machine (1);
  performing at least one armature voltage measurement (10, 11, 12) in said phase of the armature winding of a synchronous machine (1);
  calculating a theoretical excitation current (15) as a function of the at least one armature current measurement (7, 8, 9) and of the at least one armature voltage measurement (10, 11, 12);
  multiplying the calculated theoretical excitation current (15) by a coefficient, k (16);
  making a comparison between the excitation current measurement (13) and the calculated theoretical excitation current (15), multiplied by the coefficient, "k" (16);
  sending a trip signal (19) to a protection device, if it detects that the value of the excitation current measurement (13) is greater than the calculated theoretical excitation current (15), multiplied by the coefficient, k (16).

Preferably, the method for protecting against faults between turns comprises delaying the sending of the trip signal (19) to the protection device, during a certain time interval (Ton), with the aim of preventing spurious trips. In this manner, if after the mentioned certain time interval (Ton) has passed, it is detected that the value of the excitation current measurement (13) continues to be greater than the calculated theoretical excitation current (15), multiplied by the coefficient, k (16), the trip signal (19) is sent to the protection device.

The embodiments illustrated herein are mere examples of the present invention and should therefore not be construed as being limiting. Alternatives provided by a skilled person in consideration of the embodiments are likewise encompassed by the scope of protection of the present invention. Accordingly, the foregoing description is intended to be illustrative rather than restrictive. The invention described hereinabove is defined by the appended claims and all changes to the invention that fall within the meaning and range of equivalency of the claims are to be embraced within their scope.

The invention claimed is:

1. A system for protecting against faults between turns in excitation windings of a synchronous machine with static excitation, wherein the system comprises:
    at least one excitation current sensor, connected to the excitation winding of the synchronous machine;
    at least one armature current meter, connected to a phase of an armature winding of the synchronous machine;
    at least one armature voltage meter, connected to the phase of the armature winding of the synchronous machine;
    a calculation module, connected to the at least one armature current meter and to the at least one armature voltage meter, wherein the calculation module is configured to calculate a theoretical excitation current as a function of at least one armature current measurement and at least one armature voltage measurement; and
    a comparator module, connected to the at least one excitation current sensor and to the calculation module, wherein the comparator module configured to:
        make a comparison between at least one excitation current measurement and the theoretical excitation current multiplied by a certain coefficient, and
        send a trip signal to a protection device, if the comparator module detects that the at least one excitation current measurement is greater than the theoretical excitation current multiplied by the certain coefficient.

2. The system of claim 1, wherein the system comprises a timer connected to the comparator module, wherein the timer is configured to delay, during a predetermined time interval, sending the trip signal to the protection device.

3. The system of claim 1, wherein the system comprises three armature current meters, each respectively connected to a phase of the armature winding of the synchronous machine, and three armature voltage meters, each respectively connected to the phase of the armature winding of the synchronous machine.

4. The system of claim 1, wherein the system comprises two armature current meters, each respectively connected to a phase of the armature winding of the synchronous machine, and two armature voltage meters, each respectively connected to the phases of the armature winding of the synchronous machine.

5. The system of claim 1, wherein each armature current meter comprises a current transformer.

6. The system of claim 1, wherein each armature voltage meter comprises a voltage transformer.

7. A method for protecting against faults between turns in excitation windings a synchronous machine with static excitation, wherein the method comprises:
    performing at least one excitation current measurement in the excitation windings of the synchronous machine;
    performing at least one armature current measurement in at least one phase of an armature winding of the synchronous machine;
    performing at least one armature voltage measurement in the at least one phase of the armature winding of the synchronous machine;
    calculating a theoretical excitation current as a function of the at least one armature current measurement and of the at least one armature voltage measurement;
    multiplying the calculated theoretical excitation current by a coefficient;
    making a comparison between an excitation current measurement and the calculated theoretical excitation current, multiplied by the coefficient; and
    sending a trip signal to a protection device if the value of the excitation current measurement is greater than the calculated theoretical excitation current, multiplied by the coefficient.

8. The method of claim 7, wherein the method comprises delaying the sending of the trip signal to the protection device, during a certain time interval.

9. The method of claim 7, wherein the method comprises performing at least one armature current measurement in each of three phases of the armature winding of the synchronous machine, and; performing at least one armature voltage measurement in each of the three phases of the armature winding of the synchronous machine.

10. The method of claim 7, wherein the method comprises performing at least one armature current measurement in two of three phases of the armature winding of the synchronous machine, and; performing at least one armature voltage measurement in the two of the three phases of the armature winding of the synchronous machine.

11. The method of claim 8, wherein the method comprises performing at least one armature current measurement in each of the three phases of the armature winding of the synchronous machine, and; performing at least one armature voltage measurement in each of the three phases of the armature winding of the synchronous machine.

12. The method of claim 8, wherein the method comprises performing at least one armature current measurement in two of the three phases of the armature winding of the synchronous machine, and; performing at least one armature voltage measurement in the two of the three phases of the armature winding of the synchronous machine.

* * * * *